(12) United States Patent
Whiting et al.

(10) Patent No.: US 9,219,126 B2
(45) Date of Patent: Dec. 22, 2015

(54) HIGH-K DIELECTRICS WITH A LOW-K INTERFACE FOR SOLUTION PROCESSED DEVICES

(71) Applicant: Palo Alto Research Center Incorporated, Palo Alto, CA (US)

(72) Inventors: Gregory Whiting, Menlo Park, CA (US); Tse Nga Ng, Sunnyvale, CA (US); Bing R. Hsieh, Pleasanton, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/262,491

(22) Filed: Apr. 25, 2014

(65) Prior Publication Data

US 2015/0311307 A1   Oct. 29, 2015

(51) Int. Cl.
| | | |
|---|---|---|
| *H01L 21/31* | (2006.01) | |
| *H01L 21/469* | (2006.01) | |
| *H01L 29/51* | (2006.01) | |
| *H01L 29/78* | (2006.01) | |
| *H01L 21/28* | (2006.01) | |
| *H01L 27/06* | (2006.01) | |

(52) U.S. Cl.
CPC ........ *H01L 29/511* (2013.01); *H01L 21/28229* (2013.01); *H01L 27/0629* (2013.01); *H01L 29/78* (2013.01)

(58) Field of Classification Search
CPC . H01L 21/048; H01L 21/3141; H01L 23/345; H01L 28/40; H01L 28/60; H01L 29/435; H01L 29/66045; H01L 51/0034; H01L 51/0043
USPC ......... 438/197, 238, 381, 780, 769, 743, 744, 438/779; 257/288, 649, E21.006, E21.007, 257/E21.051, E21.127, E21.267, E21.278, 257/E21.293, E21.4, E21.421
See application file for complete search history.

(56) References Cited

U.S. PATENT DOCUMENTS

| | | | | |
|---|---|---|---|---|
| 4,784,932 A | * | 11/1988 | Nakamura et al. | 430/203 |
| 7,879,688 B2 | * | 2/2011 | Novack et al. | 438/458 |
| 8,929,054 B2 | * | 1/2015 | Felten et al. | 361/311 |
| 2013/0194723 A1 | * | 8/2013 | Felten et al. | 361/502 |

* cited by examiner

*Primary Examiner* — David Nhu
(74) *Attorney, Agent, or Firm* — Marger Johnson

(57) ABSTRACT

A device, including a substrate, an electronically active component on the substrate, an interface dielectric on the semiconductor, and a relaxor dielectric on the interface dielectric. The relaxor dielectric includes a surfactant that is solid at room temperature.

19 Claims, 5 Drawing Sheets

HIGH-K DIELECTRICS WITH A LOW-K INTERFACE FOR SOLUTION PROCESSED DEVICES

BACKGROUND

Solution processed and printed field effect transistors (FETs) typically require a low k dielectric layer in order to yield high charge transport mobility and ensure high charge transport mobility and ensure that the solvents used are compatible with other solution processed materials. Soluble perfluoropolymers are soluble in perfluorinated solvents that are generally orthogonal to semiconductor processes, meaning that they do not dissolve or otherwise damage the semiconductor processes. They allow top-gate devices to be made without concern for dissolving the underlying semiconductor layer. In addition, the low-k interface with the semiconductor that these perfluoropolymers provide also prevents charge trapping at the interface for both electrons and holes, typically leading to high charge transport mobilities for solution processed organic semiconductors.

These two factors allow a single dielectric material to be used for both FET polarities in complementary circuits, greatly simplifying the production of these circuits. However, using these materials has some downsides. The low dielectric constant (k) of these materials leads to low capacitance and therefore high operating voltages. To reduce the operating voltages, the processes try to keep the dielectric as thin as possible. In printed FETs, the underlying layers may be rough. The process may have difficulties producing pin-hole free films. Thinning the dielectric to give the desired operating voltage can lead to significant amounts of gate leakage. In addition, perfluoropolymer dielectric has a very low surface energy that makes further solution processing on top of it difficult without further surface modification.

DETAILED DESCRIPTION OF THE EMBODIMENTS

Figure 1:
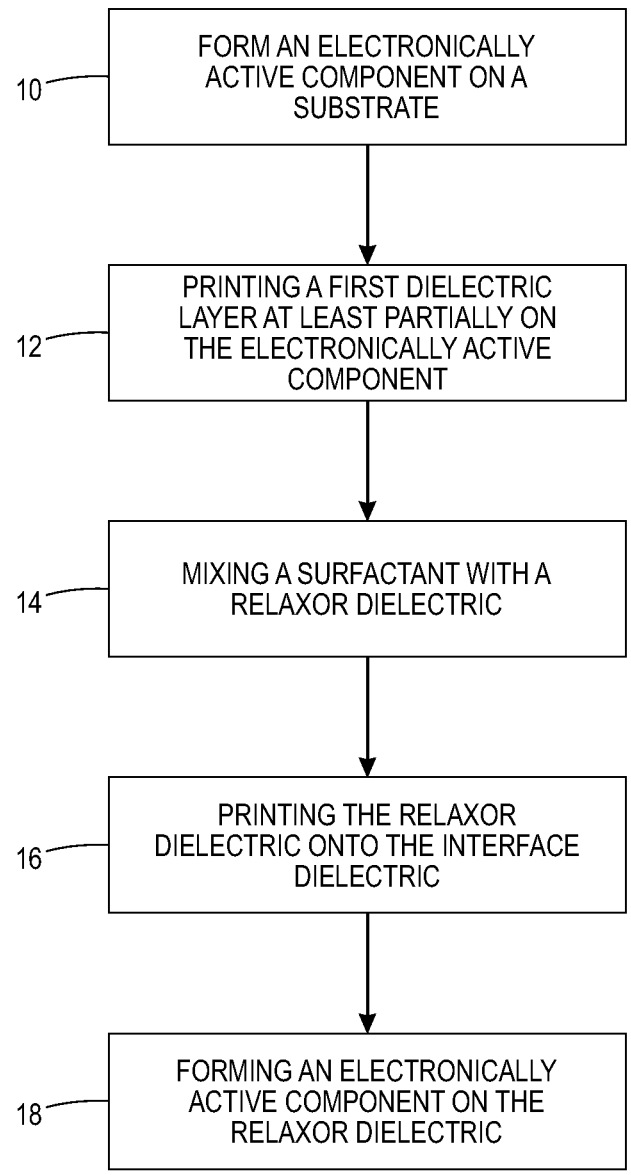
FIG. 1 shows an embodiment of a method of forming a device having a multi-layer dielectric.

Solution processed and printed electronic devices benefit from a low-k dielectric layer to yield high charge transport mobility and to ensure solvent compatibility with other solution processed and printed materials. The low-k materials have an interface with semiconductors that prevent charge trapping at the interface for both electrons and holes, generally leading to high charge transport mobilities for solution processed organic semiconductors. As the term is used here, 'low-k' refers to the dielectric constant of the material. Typically, the terms 'low' and 'hi' have to do with their dielectric constants when compared to silicon dioxide.

However, using these materials can result in low capacitance and therefore high operating voltages. In order to reduce the voltage, the processes typically try to make the dielectric as thin as possible. In printed circuits, the underlying layers may be rough so thin dielectrics may not work well. In addition, some low-k dielectrics such as perfluoropolymers dielectrics have low surface energies making further processing on top of it difficult.

The embodiments discussed here employ a multi-layer dielectric, specifically in these embodiments a bi-layer dielectric. The first layer of the dielectric is a low-k material deposited onto the semiconductor to form an interface with the semiconductor. This layer may be referred to as an interface layer. In one embodiment, the low-k material may consist of a perfluoropolymer. The second layer of the dielectric may consist of a high-k material and will form a thicker layer of dielectric, eliminating the problem with thinner layers.

One embodiment uses a high-k PVDF copolymer relaxor and may be referred to here as a relaxor layer, with the understanding that the high-k material may be one of many different materials. Typically, PVDF and associated co-polymers have demonstrated a ferroelectric effect that is no desirable for use in certain electronic components such as FETs. This leads to hysteretic behavior. Addition of some monomers such as chlorofluoroethylene disrupt alignment of the polymer, reducing the Curie temperature below room temperature. The embodiments discussed here refer to a relaxor layer and a relaxor dielectric. One must note that the high-k dielectric may not be a relaxor polymer, but instead a high-k dielectric of a nanoparticle blend with a surfactant.

One embodiment alleviates the problem of low-surface energy with the addition of a surfactant. This particular surfactant may consist of a solid at room temperature material. It reduces the surface tension of the relaxor solution allowing solution processing of the high-k relaxor polymer directly onto the low-k perfluropolymer. In one embodiment, the surfactant may consist of a methacrylate-based fluorinated graft copolymer. Generally, the surfactant will be soluble in the solvents in which the high-k polymer is also soluble, reduces surface tension enough to enable good film formation when solution processed on top of the high-k surface. Typically the surfactant is solid at room temperature so it will remain a solid part of the final film. Most of the surfactants used in other processes are viscous liquids at room temperatures. The processes generally do not remove the liquids, leaving a liquid component in the final film. Using solid surfactants in a solvent has an advantage that the final film is solid once the solvent evaporates.

While adding this surfactant to the relaxor polymer allows it to be solution-processed on top of the low-k material, it also may decrease the resulting surface energy of the relaxor layer. This may make printing of other electronically active components, such as gate electrode and capacitor electrodes difficult. The surfactant concentration should be low enough relative to the concentration of the relaxor polymer with which it is mixed to allow for further solution processing on top of the relaxor polymer, but high enough relative to the amount of solvent to retain a high enough surface energy to allow printing or further film deposition on top of the relaxor film. This processing window will vary depending upon the materials used.

One embodiment uses methyl ethyl ketone as a solvent for the relaxor polymer and the methacrylate-based fluorinated graft copolymer previously mentioned. Other examples of different polymers and solvents are shown in the table below.

| Polymer | Solvent | Surfactant concentration In solution | Surfactant concentration dry | Forms a solution-case film | Print on surface | Useful solution |
|---|---|---|---|---|---|---|
| Polymethyl methacrylate | Trifluorotoluene | 0 | | N | | N |
| | | 0.0001 | 0.1 | N | | N |
| | | 0.01 | 1 | N | | N |
| | | 1 | 10 | N | | N |
| Cyanoethyl pullulan | n-methyl-2-pyrrolidone | 0 | | N | | N |
| | | .001 | 0.1 | N | | N |
| | | 0.01 | 1 | N | | N |
| | | 0.1 | 10 | Y | N | N |
| | | 1 | | Y | N | N |
| P(VDF-TrFE-CFE) | Methyl ethyl ketone | 0 | | N | | N |
| | | 0.001 | 0.1 | N | | N |
| | | 0.01 | 1 | Y | Y | Y |
| | | 0.1 | 10 | Y | Y | Y |
| | | 1 | | Y | N | N |
| Polystyrene | Toluene | 0 | 0 | N | | N |
| | | 0.001 | 0.1 | N | | N |
| | | 0.01 | 1 | Y | Y | Y |
| | | 0.1 | 10 | Y | N | N |
| | | 1 | | Y | N | N |

FIG. 1 shows an embodiment of a process to manufacture a device using a bi-layer dielectric. At 10, an electronically active component on a substrate. The substrate may be any material typically used as a substrate such as ceramic, silicon, PEN (polyethylene naphthalate), etc. The electronically active component consists of any electrically conductive structure that may form all or part of a device, such as a portion of a transistor, an electrode, etc. Examples of processes and the resulting structures will be discussed in more detail later.

At 12, a first layer of the bi-layer dielectric is printed on the substrate and at least partially on the electronically active component. One must note that 'printing' involves any type of solution processing where a solution of the appropriate material is dispensed from some sort of the liquid dispensing device. As mentioned above, the first interface dielectric layer is a low-k dielectric. One example of such a material is a perfluorpolymer.

At 14, a relaxor dielectric is mixed with a surfactant. The surfactant will generally consist of a solid at room temperature surfactant. This may involve the use of a solvent to dissolve the solid surfactant and allow it to be dispensed. The relaxor dielectric with the surfactant is then dispensed onto the interface dielectric. This layer may be printed to be much thicker than the low-k dielectric, which alleviates the issues with the thin layers mentioned previously.

Finally, at 18, another electronically active component on the relaxor dielectric. This may be optional depending upon the nature of the electronic device being printed. Examples of these device will be discussed with regard to FIGS. 2 and 3.

Figure 2:
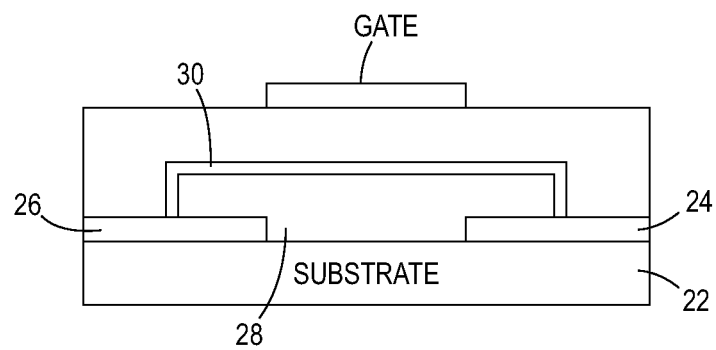
FIG. 2 shows an embodiment of a top-gate printed TFT structure having a multi-layer dielectric.
Figure 3:
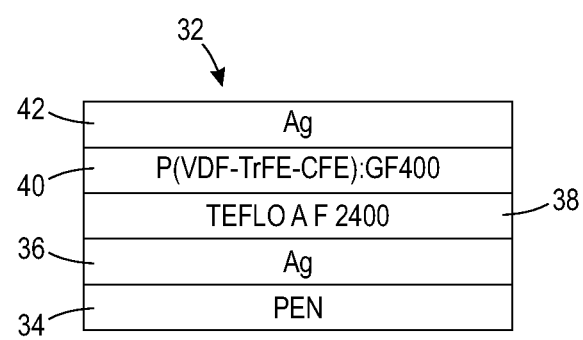
FIG. 3 shows an embodiment of a capacitor formed from the multi-layer dielectric.

For example, in FIG. 2, the device is a transistor. The first electronically active component printed on the substrate 22 would be a source 24 and drain 26. The semiconductor 28 is formed between the source 24 and drain 26. The first layer, low-k dielectric layer 30 is then printed on the semiconductor. A thicker layer of high-k dielectric is then printed on top of the low-k layer. The gate of the transistor is then printed on the high-k relaxor dielectric. This consists of just one example. FIG. 3 provides another example.

Figure 4:
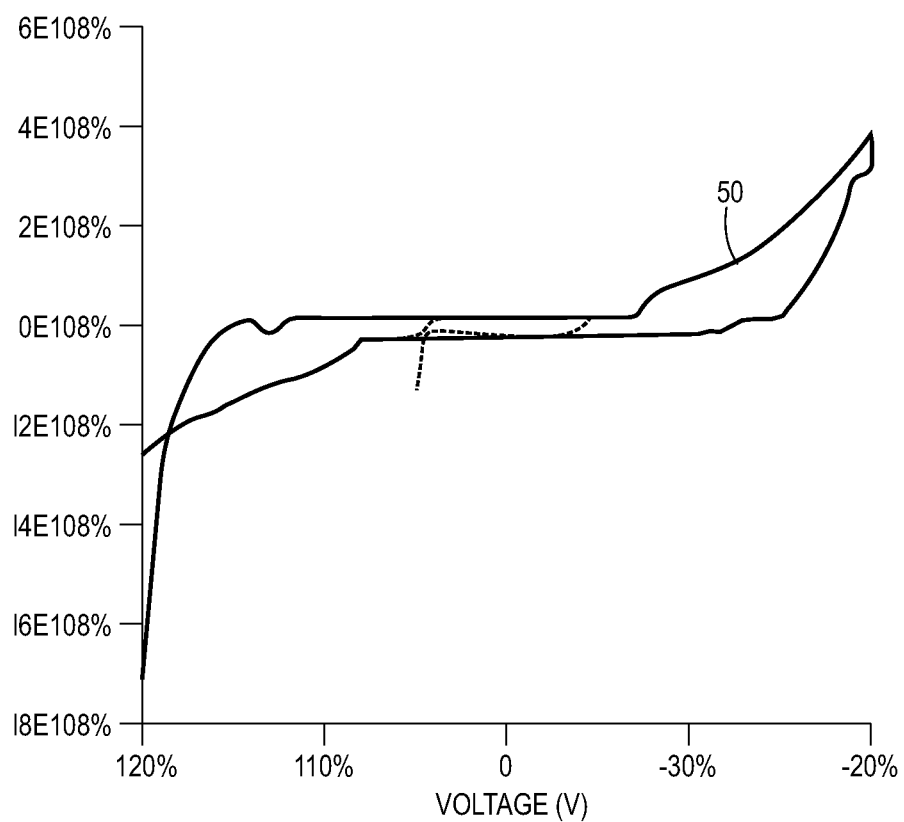
FIG. 4 shows a graph of voltage v. current for a multi-layer dielectric capacitor.

In FIG. 3, the resulting device is a capacitor. This particular embodiment uses a plastic (PEN or polyethylene naphthalate) substrate 34, with silver printed as the electrode 36. The low-k dielectric layer in this embodiment is Teflon AF, and then the P(VDF-TrFE-CFE), as the high-k dielectric layer. In this embodiment these were spin coated and the top electrode was ink-jet printed onto the dielectric. The resulting capacitor shows an areal capacitance of 20.9±0.4 nF cm$^{-2}$, suitably low leakage currents and low hysteresis. The resulting voltage versus current curve 50 is shown in FIG. 4.

Other examples include ink-jet printed complementary inverters using the described bi-layer dielectric and organic n- and p-type semiconductors. These devices had a typical overall dielectric thickness [~0.5 μm (30 nm Teflon AF/0.5 μm P(VDF-TrFE-CFE:GF400)] used for printed FETs to ensure low gate leakage. GF400 is a methacrylate-based fluorinated graft copolymer manufactured by Toagosei. These devices had an areal capacitance of 32 nF cm$^{-2}$, and showed the expected performance for the FETs. These operating voltages are low for printed FETs that typically operate in the 10 s of volts. Low voltage operation is desirable particularly as it allows printed electronic devices to be driven using simple batteries. If lower voltage operation is not required, this dielectric enables much thicker films to be used for operations in the 10 s of volts, reducing leakage currents and simplifying processing.

Figure 5:
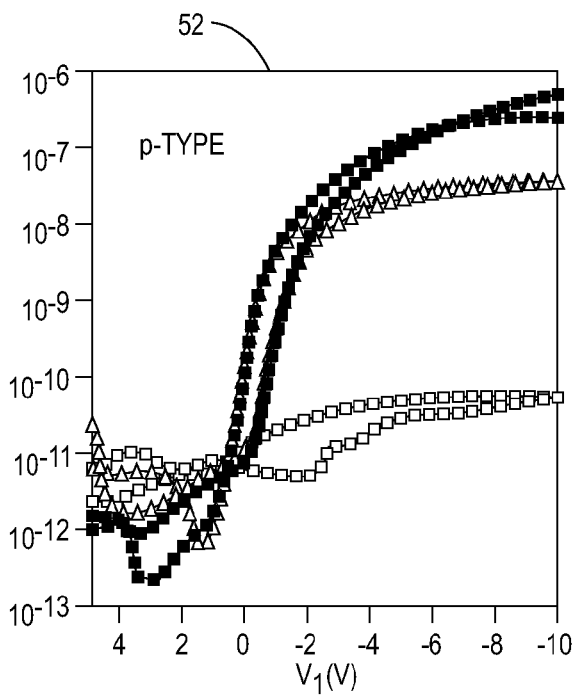
FIGS. 5-8 show graphs of characteristics of a complementary printed inverter having a high capacitance multi-layer dielectric.
Figure 6:
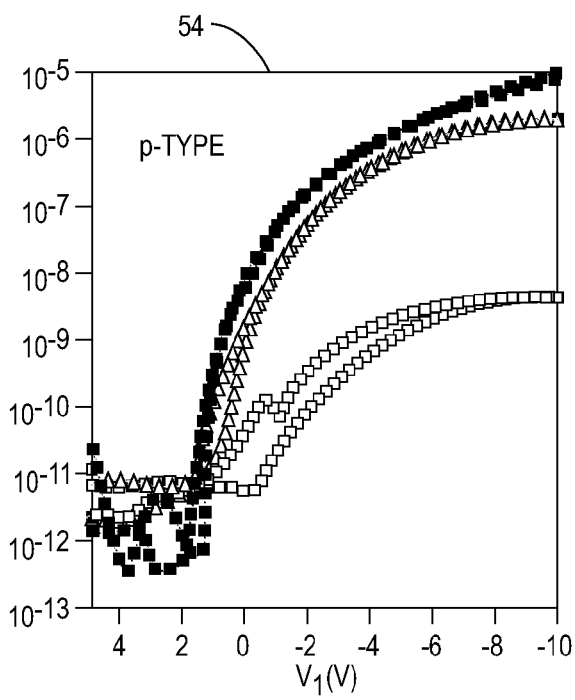
Figure 7:
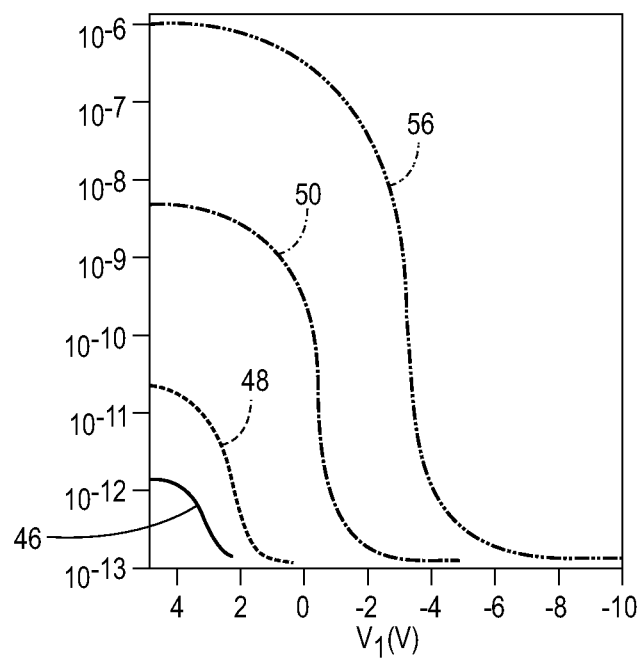
Figure 8:
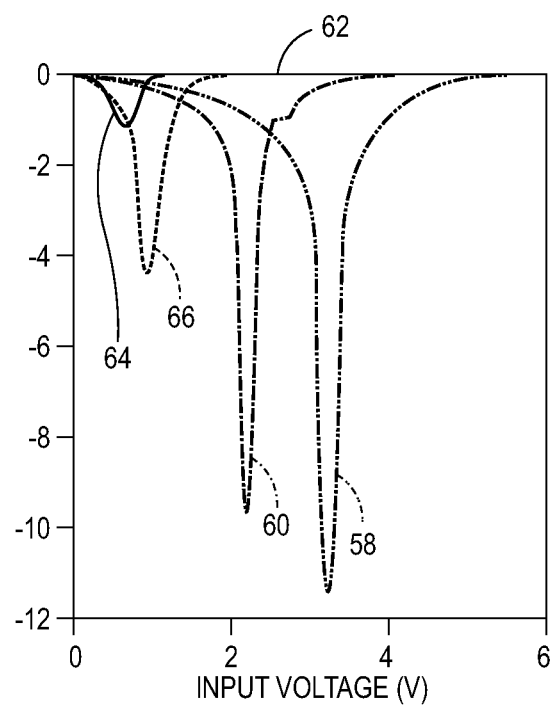

FIGS. 5-8 show characteristics of these inverters. FIG. 5 shows the p-type characteristics 52, and FIG. 6 shows the n-type characteristics 54. FIG. 7 shows curves 46, 48, 50 and 56 of various input versus output voltages. FIG. 8 shows various curves 58, 60, 62, 64 and 66 of input voltage versus gain.

In this manner, a bi-layer dielectric provides a desirable low-k dielectric interface with the semiconductor and a high-k, thicker dielectric for better performance in printed electronic devices.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:
1. A device, comprising:
    a substrate;
    an electronically active component on the substrate;
    an interface dielectric at least partially on the electrically active component; and a relaxor dielectric on the interface dielectric, wherein the relaxor dielectric includes a surfactant that is solid at room temperature and has a higher dielectric constant than the interface dielectric.

2. The device of claim 1, further comprising a source and a drain on the substrate at least partially covered by the electronically active layer, and the electronically active layer comprises a semiconductor.

3. The device of claim 2, further comprising a gate on the interface dielectric.

4. The device of claim 1, wherein the interface dielectric comprises one of a dielectric or a nanoparticle blend.

5. The device of claim 1, wherein the interface dielectric comprises a perfluoropolymer.

6. The device of claim 1, wherein the interface dielectric comprises a high-k PVDF-copolymer.

7. The device of claim 1, wherein the surfactant comprises a methacrylate-based fluorinated copolymer.

8. The device of claim 1, wherein the surfactant and the interface dielectric are soluble in the same solvents.

9. The device of claim 1, wherein the surfactant concentration in the interface dielectric is low enough to allow for further solution processing and high enough to allow formation of a film on the surface of the dielectric.

10. The device of claim 1, wherein the electronically active layer comprises a metal electrode.

11. The device of claim 8, wherein the device further comprises a capacitor having a second electrode on the interface dielectric.

12. A method of manufacturing an electronic device, comprising:
    forming an electronically active component on a substrate;
    printing an interface dielectric over the electronically active component;
    mixing a solid surfactant with a second dielectric; and
    printing the second dielectric onto the interface dielectric.

13. The method of claim 10, wherein forming an electronically active component comprises forming a source and drain on the substrate.

14. The method of claim 13, further comprising forming a gate on the interface dielectric.

15. The method of claim 12, wherein forming an electronically active component comprises forming a metal electrode on the substrate.

16. The method of claim 15, further comprising forming a second electrode on the interface dielectric.

17. The method of claim 12, wherein printing an interface dielectric comprises printing a perfluopolymer.

18. The method of claim 11, wherein mixing a solid surfactant with a dielectric, comprises mixing one of trifluorotoluene, n-methyl-2-pyrrolidone, methyl ethyl ketone, and toluene, with one of poly(methylmethacrylate), cyanoethyl pullulan, P(VDF-TrFE-CFE), P(VDF-TrFE-CTFE), and polystyrene.

19. A device, comprising:
    a substrate;
    a source and a drain on the substrate;
    an electronically active component comprising a semiconductor on the substrate at least partially covering the source and drain;
    an interface dielectric on the electrically active component; and
    a relaxor dielectric on the interface dielectric, wherein the relaxor dielectric includes a surfactant that is solid at room temperature.

* * * * *